(12) United States Patent
Choi et al.

(10) Patent No.: US 12,465,935 B2
(45) Date of Patent: Nov. 11, 2025

(54) UNIT FOR STORING LIQUID AND APPARATUS FOR TREATING SUBSTRATE

(71) Applicant: SEMES CO., LTD., Cheonan-si (KR)

(72) Inventors: Moon Soon Choi, Cheonan-si (KR); Chae Young Lim, Cheonan-si (KR); Do Gyeong Ha, Daegu (KR); Gu Yeol An, Busan (KR)

(73) Assignee: Semes Co., Ltd., Chungcheongnam-do (KR)

( * ) Notice: Subject to any disclaimer, the term of this patent is extended or adjusted under 35 U.S.C. 154(b) by 382 days.

(21) Appl. No.: 17/941,526

(22) Filed: Sep. 9, 2022

(65) Prior Publication Data

US 2023/0089188 A1 Mar. 23, 2023

(30) Foreign Application Priority Data

Sep. 17, 2021 (KR) .......................... 10-2021-0124786

(51) Int. Cl.
| | | |
|---|---|---|
| *B05B 9/04* | (2006.01) | |
| *B65D 1/32* | (2006.01) | |
| *H01L 21/67* | (2006.01) | |
| *B05C 11/10* | (2006.01) | |
| *B08B 3/02* | (2006.01) | |

(52) U.S. Cl.
CPC ............ *B05B 9/0403* (2013.01); *B65D 1/323* (2013.01); *H01L 21/67017* (2013.01); *H01L 21/67051* (2013.01); *B05C 11/1013* (2013.01); *B05C 11/1042* (2013.01); *B08B 3/02* (2013.01)

(58) Field of Classification Search
CPC ............ B05B 9/0403; H01L 21/67017; H01L 21/67051; B08B 3/02; B05C 11/1013; B05C 11/1042; B65D 1/323
See application file for complete search history.

(56) References Cited

U.S. PATENT DOCUMENTS

| | | | | |
|---|---|---|---|---|
| 4,958,747 A | * | 9/1990 | Sheets ................. | B67D 3/0009 222/146.6 |
| 5,011,045 A | * | 4/1991 | Tammi .................... | B44D 3/08 222/510 |

(Continued)

FOREIGN PATENT DOCUMENTS

| | | |
|---|---|---|
| CN | 105261577 A | 1/2016 |
| CN | 110931389 A | 3/2020 |

(Continued)

OTHER PUBLICATIONS

Korean Office Action dated Feb. 28, 2024 issued in corresponding Korean Patent Application No. 10-2021-0124786.

(Continued)

*Primary Examiner* — Frederick C Nicolas
(74) *Attorney, Agent, or Firm* — Harness, Dickey & Pierce, P.L.C.

(57) ABSTRACT

The inventive concept provides a liquid storage unit. The liquid storage unit includes a tank housing defining a storing space therein; a liquid outlet pipe penetrating into the tank housing and having an outlet formed thereon; and a liquid inlet pipe penetrating into the tank housing and having an inlet formed thereon, and wherein a first guide surface is provided between the outlet and the inlet.

20 Claims, 13 Drawing Sheets
(1 of 13 Drawing Sheet(s) Filed in Color)

(56) References Cited

U.S. PATENT DOCUMENTS

| | | | | |
|---|---|---|---|---|
| 5,680,960 | A | * | 10/1997 | Keyes ................... G01F 11/284 |
| | | | | 222/64 |
| 6,139,726 | A | * | 10/2000 | Greene ..................... C02F 9/20 |
| | | | | 210/97 |
| 6,648,174 | B2 | * | 11/2003 | Greene ................... C02F 1/325 |
| | | | | 222/66 |
| 7,002,161 | B2 | * | 2/2006 | Greene ................... C02F 1/325 |
| | | | | 250/435 |
| 8,230,692 | B2 | * | 7/2012 | Moon ................. B67D 1/0862 |
| | | | | 62/115 |
| 10,933,448 | B2 | | 3/2021 | Yasuda et al. |
| 11,794,219 | B2 | * | 10/2023 | Yang ................. H01L 21/67017 |
| 11,794,220 | B2 | * | 10/2023 | Park ...................... B08B 7/0021 |
| 2003/0132250 | A1 | * | 7/2003 | Greene ................... C02F 1/325 |
| | | | | 222/190 |

FOREIGN PATENT DOCUMENTS

| | | |
|---|---|---|
| JP | 2007-258648 A | 10/2007 |
| JP | 2012-114211 A | 6/2012 |
| JP | 2012-153383 A | 8/2012 |
| JP | 7110543 B2 | 8/2022 |
| KR | 10-0166208 B1 | 2/1999 |
| KR | 10-2018-0109911 A | 10/2018 |
| KR | 10-2019-0022956 A | 3/2019 |
| KR | 10-2020-0033754 A | 3/2020 |
| WO | WO-2017/135064 A1 | 8/2017 |

OTHER PUBLICATIONS

Korean Office Action, dated Jun. 9, 2023, issued in Korean Patent Application No. 10-2021-0124786.
Taiwanese Office Action dated Apr. 7, 2023 issued in corresponding Taiwanese Appln. No. 11220316440.
Japanese Office Action dated Dec. 5, 2023 issued in corresponding Japanese Patent Application No. 2022-144469.
Taiwanese Office Action dated Dec. 8, 2023 issued in corresponding Taiwanese Patent Application No. 111134597.

* cited by examiner

UNIT FOR STORING LIQUID AND APPARATUS FOR TREATING SUBSTRATE

CROSS-REFERENCE TO RELATED APPLICATIONS

A claim for priority under 35 U.S.C. § 119 is made to Korean Patent Application No. 10-2021-0124786 filed on Sep. 17, 2021, in the Korean Intellectual Property Office, the entire contents of which are hereby incorporated by reference.

BACKGROUND

Embodiments of the inventive concept described herein relate to a liquid storage unit and a substrate treating apparatus.

In order to manufacture a semiconductor element or a liquid crystal display, various processes such as a photolithography process, an etching process, an ashing process, an ion implantation process, and a thin film deposition process are performed on a substrate. A cleaning process for cleaning the substrate is carried out before or after each process to remove contaminants and particles generated at each process.

For the cleaning process, a chemical is supplied from a liquid supply system to a treating apparatus, and a process of treating the substrate using the chemical which has been supplied is performed. The liquid supply system is provided with a chemical storage tank for storing the chemical, and the chemical storage tank is connected thereto, and the chemical is mixed by circulating the chemical along a circulation line provided with a temperature control member, and a temperature of the chemical is adjusted.

SUMMARY

Embodiments of the inventive concept provide a liquid storage unit and a substrate treating apparatus for minimizing a generation of an air bubble by a chemical which has circulated and returned through a circulation line.

Embodiments of the inventive concept provide a liquid storage unit and a substrate treating apparatus for uniformly mixing a chemical in the liquid storage unit and for stabilizing a temperature distribution, as there is an issue of a chemical which has circulated and returned through a circulation line creating an invisible fluid channel along an inlet within the liquid storage unit, which fails to cause a circulation within the apparatus and causes a stagnation in some positions.

The technical objectives of the inventive concept are not limited to the above-mentioned ones, and the other unmentioned technical objects will become apparent to those skilled in the art from the following description.

The inventive concept provides a liquid storage unit. The liquid storage unit includes a tank housing defining a storing space therein; a liquid outlet pipe penetrating into the tank housing and having an outlet formed thereon; and a liquid inlet pipe penetrating into the tank housing and having an inlet formed thereon, and wherein a first guide surface is provided between the outlet and the inlet.

In an embodiment, the first guide surface is formed so a flow of a liquid introduced from the inlet is guided further away from the outlet.

In an embodiment, the first guide surface is defined as a bottom surface defining the storing space.

In an embodiment, the first guide surface is provided to have a height which decreases in a direction toward a part at which the inlet is provided from a part at which the outlet is provided.

In an embodiment, a part or all of the inlet overlaps the first guide surface when seen from above.

In an embodiment, the outlet is positioned outside of a region at which the first guide wall is projected in an up/down direction.

In an embodiment, the first guide surface is a portion among a bottom surface defining the storing space, and the bottom surface has a center which upwardly protrudes and a height which decreases from the center toward an edge direction, and wherein the first guide surface is defined as a surface having the height which decreases, and the liquid outlet pipe is provided penetrating through the center which upwardly protrudes.

In an embodiment, the first guide surface is a rounded shape.

In an embodiment, the bottom surface includes a second guide surface having a height which increases from an end portion of the first guide surface toward the edge direction.

In an embodiment, the second guide surface is a rounded shape.

In an embodiment, the inlet of the liquid inlet pipe is positioned adjacent to a bottom surface of the storing space.

In an embodiment, the inlet is positioned at a position lower than a top end of the first guide surface or at the same level.

In an embodiment, the outlet is positioned at a position higher than a top portion of the first guide surface or at the same level.

In an embodiment, the inlet is positioned at a position lower than a top end of the first guide surface or at the same level, and the outlet is positioned at a position higher than a top portion of the first guide surface or at the same level.

In an embodiment, a level of the outlet is higher than a level at which the inlet is positioned.

The inventive concept provides a liquid storage unit. The liquid storage unit includes a tank housing defining a storing space therein; and a liquid outlet pipe penetrating into the tank housing and having an outlet formed thereon; and a liquid inlet pipe penetrating into the tank housing and having an inlet formed thereon, and wherein the outlet is positioned at a position higher than a position of the inlet.

In an embodiment, the liquid storage unit further includes a first line connecting the liquid outlet pipe and the liquid inlet pipe.

In an embodiment, the liquid storage unit further includes a pump provided at the first line and for generating a flow of a liquid from the liquid outlet pipe to the liquid inlet pipe.

In an embodiment, the liquid storage unit further includes a liquid charging line connected through a liquid supply source and a second line, and penetrating into the tank housing.

The inventive concept provides a substrate treating apparatus. The substrate treating apparatus includes a substrate support unit configured to support a substrate; a nozzle supplying a liquid to a substrate supported on the substrate support unit; and a liquid storage unit configured to connect to the nozzle through a first line which can transfer a fluid, and wherein the liquid storage unit includes: a tank housing defining a storing space therein; a liquid outlet pipe penetrating into the tank housing and having an outlet formed thereon, the first line connected so a fluid may be transferred; a liquid inlet pipe penetrating into the tank housing and having an inlet formed thereon, and having the inlet provided adjacent to a bottom surface of the storing space; a liquid charging line connected through a liquid supply source and the second line, and penetrating into the tank housing; a connecting line connecting the liquid outlet pipe and the liquid inlet pipe; and a pump provided at the connecting line and generating a flow of a liquid from the liquid outlet pipe to the liquid inlet pipe, and wherein a first guide surface is provided between the outlet and the inlet, the first guide surface is a partial region among a bottom surface defining the storing space, the bottom surface has a center which upwardly protrudes and a height which decreases from an upwardly protruding part toward an edge direction, the first guide surface is defined as a surface having a height which decreases, and the liquid outlet pipe is provided penetrating through the center which upwardly protrudes, the inlet is positioned lower than a top end of the first guide surface or at the same level, and the outlet is positioned at a position higher than a top portion of the first guide surface or at the same level.

According to an embodiment of the inventive concept, a generation of an air bubble by a chemical which has circulated and returned may be minimized.

According to an embodiment of the inventive concept, a chemical in a liquid storage unit may be uniformly mixed and a temperature distribution may be stabilized.

The effects of the inventive concept are not limited to the above-mentioned ones, and the other unmentioned effects will become apparent to those skilled in the art from the following description.

BRIEF DESCRIPTION OF THE FIGURES

The patent or application file contains at least one drawing executed in color. Copies of this patent or patent application publication with color drawing(s) will be provided by the Office upon request and payment of the necessary fee.

The above and other objects and features will become apparent from the following description with reference to the following figures, wherein like reference numerals refer to like parts throughout the various figures unless otherwise specified, and wherein.

DETAILED DESCRIPTION

Figure 1:
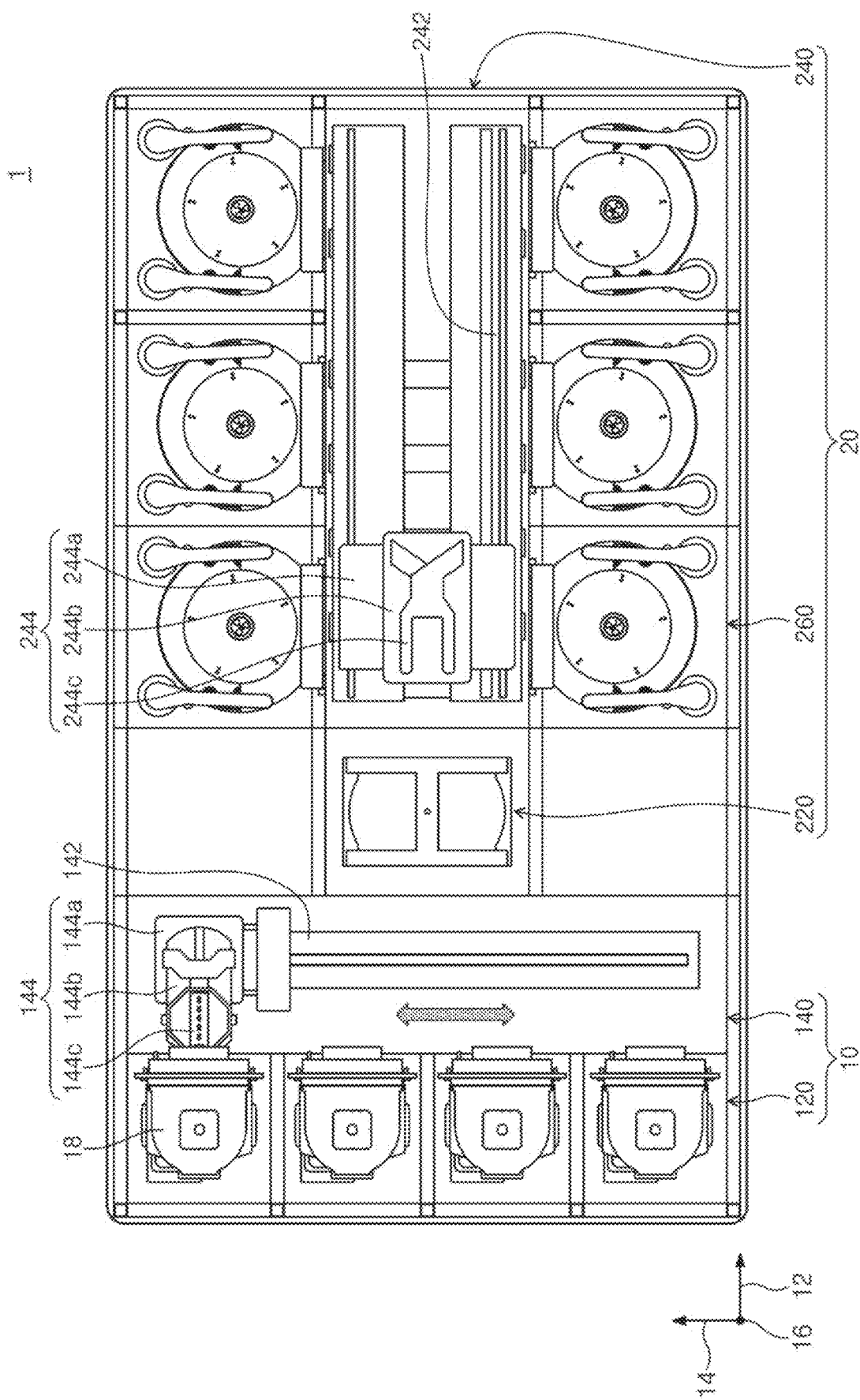
FIG. 1 is a plan view illustrating a substrate treating facility according to an embodiment of the inventive concept.

Hereinafter, embodiments of this invention will be described in detail with reference to the accompanying drawings so that those of ordinary skill in the technical field to which this invention belongs can easily implement this invention. However, the inventive concept may be implemented in various different forms and is not limited to the embodiments described herein. In addition, in describing a correct embodiment of the inventive concept in detail, when it is determined that a detailed description of related known functions or configurations may unnecessarily obscure the gist of the inventive concept, the detailed description thereof will be omitted. In addition, a same sign is used throughout the drawing for parts with similar functions and actions.

To "include" or "comprise" a component means that it may include more other components, not excluding other components unless otherwise stated. Specifically, the term "include", "comprise" or "have" should be understood to designate that there are features, numbers, steps, operations, components, or a combination thereof described in the specification, and do not preclude the presence or addition of one or more other features or numbers, steps, operations, components, or combinations thereof.

The singular expression includes plural expressions unless the context clearly implies otherwise. In addition, shapes and sizes of elements in the drawings may be exaggerated for clearer explanation.

The term "and/or" includes any one of the listed items and all combinations of one or more. In addition, in the present specification, the term "connected" means not only a case where member A and member B are directly connected, but also a case where member C is interposed between member A and member B to indirectly connect member A and member B.

Embodiments of the inventive concept may be modified in various forms, and the scope of the inventive concept should not be construed as being limited to the following embodiments. The embodiment of the inventive concept is provided to more fully explain the inventive concept on to those with average knowledge in the art. Therefore, the shape of the elements in the drawing has been exaggerated to emphasize a clearer explanation.

FIG. 1 is a plan view illustrating a substrate treating facility according to an embodiment of the inventive concept. Referring to FIG. 1, the substrate treating facility 1 includes an index module 10 and a process treating module 20. The index module 10 includes a load port 120 and a transfer frame 140. The load port 120, the transfer frame 140, and the process treating module 20 are sequentially arranged in a direction. Hereinafter, a direction in which the load port 120, the transfer frame 140, and the process treating module 20 are arranged is referred to as a first direction 12, a direction perpendicular to the first direction 12 is referred to as a second direction 14, and a direction perpendicular to a plane including the first direction 12 and the second direction 14 is referred to as a third direction 16.

A carrier 130 at which a substrate W is stored is seated on the load port 140. A plurality of load ports 120 are provided, and they are arranged in a line along the second direction 14. The number of load ports 120 may increase or decrease according to a process efficiency and foot print conditions of the process treating module 20. A plurality of slots (not shown) for storing the substrates W in a state in which the substrates W are horizontally disposed with respect to the ground are formed at the carrier 130. A front opening unified pod (FOUP) may be used as the carrier 18.

The process treating module 20 includes a buffer unit 220, a transfer chamber 240, and a process chamber 260. A lengthwise direction of the transfer chamber 240 is disposed parallel to the first direction 12. At each side of both sides of the transfer chamber 240, process chambers 260 are disposed. The process chamber 260 are provided to be symmetrical at a side and at another side of the transfer chamber 240 with respect to the transfer chamber 240. A plurality of process chambers 260 are provided at a side of the transfer chamber 240. Some of the process chambers 260 are disposed along the lengthwise direction of the transfer chamber 240. Also, some of the process chambers 260 are disposed to be stacked on each other. That is, process chambers 260 may be arranged in an arrangement of A×B at a side of the transfer chamber 240. Here, A is the number of process chambers 260 provided in a row along the first direction 12, and B is the number of process chambers 260 provided in a row along the third direction 16. If four or six process chambers 260 are provided at a side of the transfer chamber 240, the process chambers 260 can be arranged in an arrangement of 2×2 or 3×2. The number of process chambers 260 may increase or decrease. Unlike the above description, the process chamber 260 may be provided only at one side of the transfer chamber 240. In addition, the process chamber 260 may be provided as a single layer at a side and both sides of the transfer chamber 240.

The buffer unit 220 is disposed between the transfer frame 140 and the transfer chamber 240. The buffer unit 220 provides a space at which the substrate W remains before the substrate W is transferred between the transfer chamber 240 and the transfer frame 140. A slot (not shown) in which the substrate W is placed is provided inside the buffer unit 220. A plurality of slots (not shown) are provided to be spaced apart from each other in the third direction 16. A surface of the buffer unit 220 facing the transfer frame 140 and a surface facing the transfer chamber 240 are opened.

The transfer frame 140 transfers the substrate W between the carrier 130 mounted on the load port 120 and the buffer unit 220. The transfer frame 140 is provided with an index rail 142 and an index robot 144. The index rail 142 is provided with its lengthwise direction parallel to the second direction 14. The index robot 144 is installed on the index rail 142 and is linearly moved in the second direction 14 along the index rail 142. The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be forwardly and backwardly movable with respect to the body 144b. A plurality of index arms 144c are provided to be individually driven. The index arms 144c are disposed to be stacked in a state spaced apart from each other along the third direction 16. Some of the index arms 144c may be used to transfer the substrate W from the process treating module 20 to the carrier 130, and others may be used to transfer the substrate W from the carrier 130 to the process treating module 20. This may prevent particles generated from the substrate W before the process treating from being attached to the substrate W after the process treating during a process of taking in and taking out the substrate W by the index robot 144.

The transfer chamber 240 transfers the substrate W between the buffer unit 220 and the process chamber 260 and between the process chambers 260. The transfer chamber 240 is provided with a guide rail 242 and a main robot 244. The guide rail 242 is disposed with its lengthwise direction parallel to the first direction 12. The main robot 244 is installed on the guide rail 242 and linearly moves along the first direction 12 on the guide rail 242. The main robot 244 has a base 244a, a body 244b, and a main arm 244c. The base 244a is installed to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b, which is provided to be forwardly and backwardly movable with respect to the body 244b. A plurality of main arms 244c are provided to be individually driven. The main arms 244c are disposed to be spaced apart from each other and stacked along the third direction 16.

At the process chamber 260 a substrate treating apparatus 300 (see FIG. 2) for performing a liquid treating process on the substrate W is provided. The substrate treating apparatus 300 may have a different structure depending on a type of liquid treatment process to be performed. In an embodiment, the substrate treating apparatus 300 performs a cleaning process. Unlike this, the substrate treating apparatus 300 in each of the process treating chambers 260 may have the same structure. Selectively, the process chambers 260 may be divided into a plurality of groups, and the substrate treating apparatuses 300 within a process chamber 260 belong to the same group may be the same, and a structure of a substrate treating apparatus 300 within a process chamber belong to a different group may be different from each other.

Figure 2:
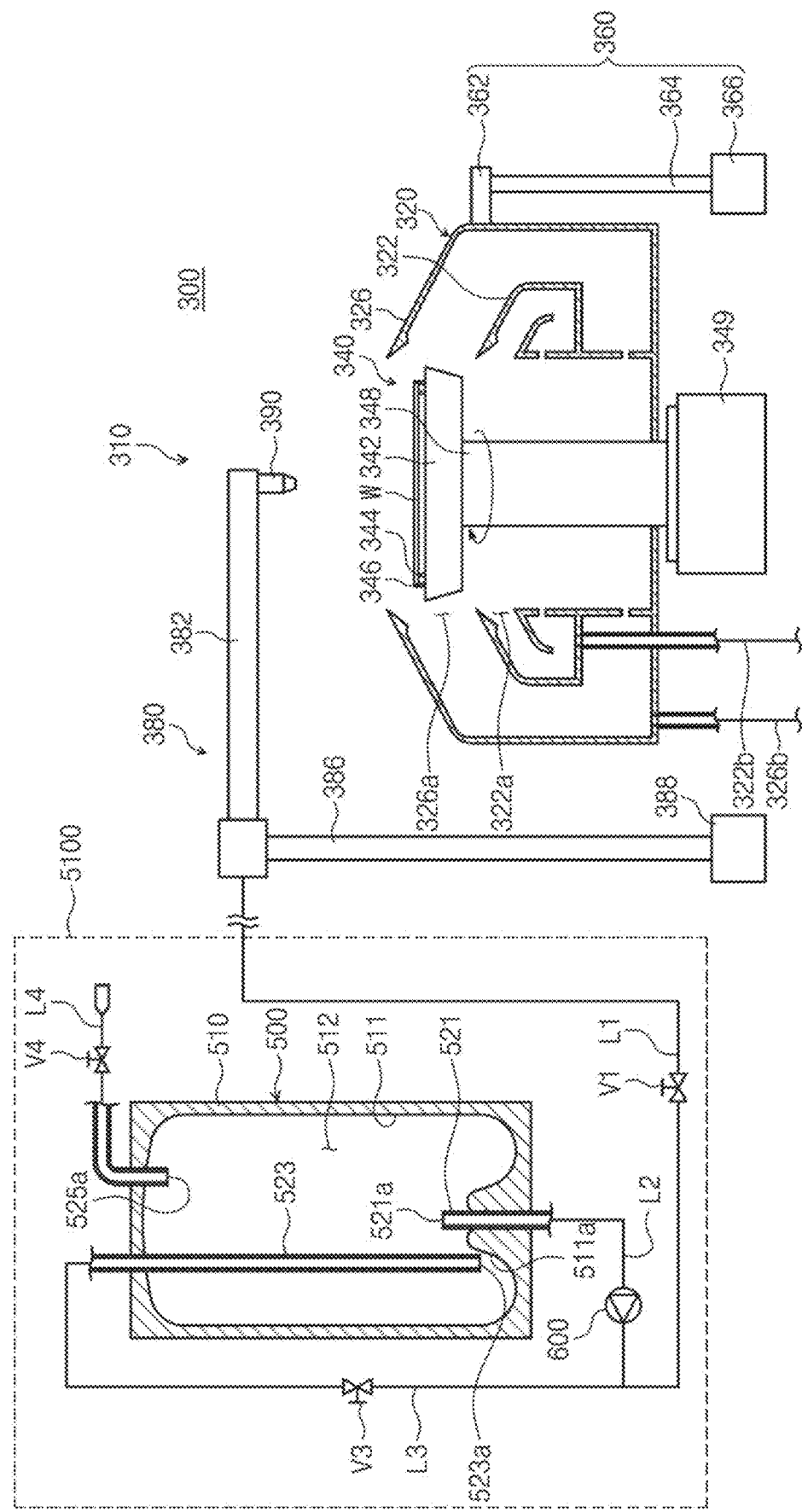
FIG. 2 is a cross-sectional view illustrating a substrate treating apparatus 300 including a liquid supply system 5100.
Figure 3:
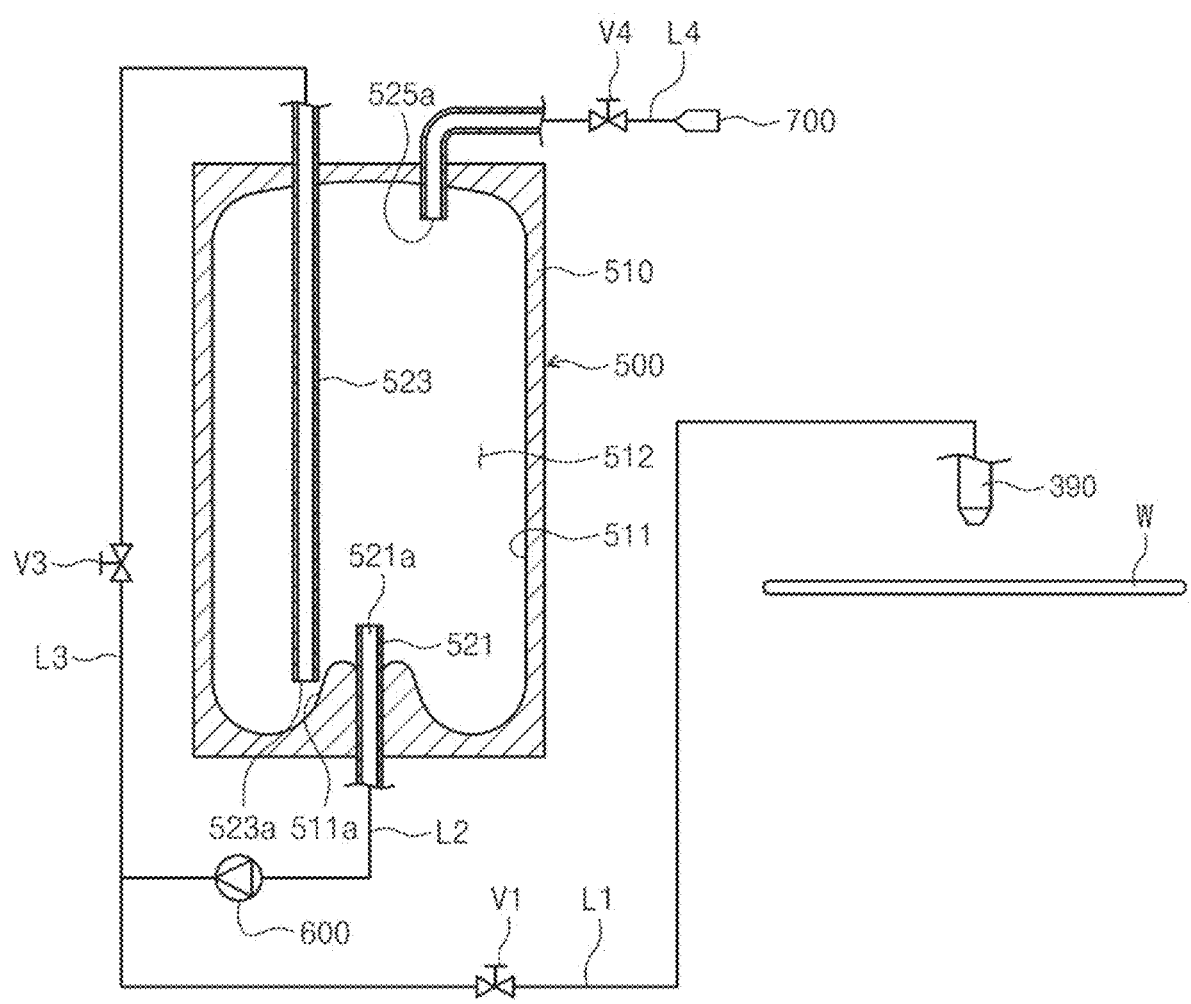
FIG. 3 is an enlarged view of the liquid supply system 5100.

FIG. 2 is a cross-sectional view illustrating a substrate treating apparatus 300 including a liquid supply system 5100. FIG. 3 is an enlarged view of the liquid supply system 5100. Referring to FIG. 2, the substrate treating apparatus 300 includes a treating unit 310. The treating unit 310 includes a housing 320, a spin head 340, a lifting/lowering unit 360, and a nozzle unit 380.

The housing 320 has a cylindrical shape with an open top. The housing 320 has an inner recollecting container 322 and an outer recollecting container 326. Each of the recollecting containers 322 and 326 recollects different chemicals used in a process. The inner recollecting container 322 is provided in an annular ring shape surrounding the spin head 340, and the outer recollecting container 326 is provided in an annular ring shape surrounding the inner recollecting container 326. An inner space 322a of the inner recollecting container 322 and a space 326a between the inner recollecting container 322 and the outer recollecting container 326, respectively, function as an inlet through which a chemical flows into the inner recollecting container 322 and the outer recollecting container 326. According to an embodiment, each inlet may be positioned at different heights. Below bottom surfaces of each of the recollecting containers 322 and 326, recollecting lines 322b and 326b are connected. The chemicals introduced into each of the recollecting containers 322 and 326 can be reused by being provided to an outer chemical regeneration system (not shown) through the recollecting lines 322b and 326b.

The spin head 340 supports and rotates the substrate W during the process. The spin head 340 has a body 342, a support pin 344, a chuck pin 346, and a support shaft 348. The body 342 has a top surface that is generally provided in a circular shape when viewed from above. A support shaft 348 rotatable by a driving unit 349 is fixedly coupled to a bottom surface of the body 342.

A plurality of support pins 344 are provided. The support pins 344 are disposed at edges of a top surface of the body 342 to be spaced apart from each other at predetermined intervals and upwardly protrude from the body 342. The support pins 344 are arranged to have an annular ring shape as a whole by combination with each other. The support pin 344 supports an edge of a bottom surface of the substrate W so that the substrate W is spaced apart from the top surface of the body 342 by a predetermined distance.

A plurality of chuck pins 346 are provided. The chuck pin 346 is disposed farther from a center of the body 342 than the support pin 344. The chuck pin 346 is provided to upwardly protrude from the body 342. The chuck pin 346 supports a side portion of the substrate W so that the substrate W is not separated from a normal position in a lateral direction when the spin head 340 is rotated. The chuck pin 346 is provided to be linearly moved between a standby position a support position along a radial direction of the body 342. The standby position is a position farther from the center of the body 342 than the support position. When the substrate W is loaded or unloaded on the spin head 340, the chuck pin 346 is positioned at the standby position, and when performing the process on the substrate W, the chuck pin 346 is positioned at the support position. At the support position, the chuck pin 346 is in contact with the side portion of the substrate W.

The lifting/lowering unit 360 moves the housing 320 linearly in an up/down direction. As the housing 320 is moved up and down, a relative height of the housing 320 with respect to the spin head 340 is changed. The lifting/lowering unit 360 has a bracket 362, a moving shaft 364, and a driver 366. The bracket 362 is fixedly installed at an outer wall of the housing 320, and the moving shaft 364 moved in the up/down direction by the driver 366 is fixedly coupled to the bracket 362. When the substrate W is placed on the spin head 340 or lifted from the spin head 340, the housing 320 is lowered so that the spin head 340 upwardly protrudes from the housing 320. Also, during the process, a height of the housing 320 is adjusted so that the chemical can flow into a predetermined recollecting container 360 according to the type of chemical supplied to the substrate W. Selectively, the lifting/lowering unit 360 may move the spin head 340 in the up/down direction.

The nozzle unit 380 includes a support shaft 386, a support 382, and a nozzle 390. The nozzle unit 380 sprays chemicals onto the substrate W. A plurality of nozzle units 380 may be provided. The support shaft 386 is disposed at a side of the housing 320. The support shaft 386 has a rod shape with its lengthwise direction is provided in the up/down direction. The support shaft 386 may be rotated and lifted/lowered by the driving member 388. Unlike this, the support shaft 386 may move linearly in a horizontal direction and be lifted/lowered by the driving member 388. The support 382 supports the nozzle 390. The support 382 is coupled to the support shaft 386, and the nozzle 390 is fixedly coupled to a bottom surface of an end portion of support 382. The nozzle 390 may be swing-moved by a rotation of the support shaft 386.

A liquid supply system 5100 will be described with reference to FIG. 3.

The liquid supply system 5100 includes a liquid storage unit 500. The liquid storage unit 500 is connected to a chemical supply source 700 through a charging line L4. The liquid storage unit 500 is connected to the nozzle 390 through a supply line L1. The nozzle 390 is configured to discharge the chemical to the substrate W.

The liquid storage unit 500 includes a tank housing 510. The tank housing 510 defines a storing space 512. In an embodiment, the tank housing 510 forms a storing space 512. A treating liquid is stored at the storing space 512.

The tank housing 510 is connected to a circulation line L3. The tank housing 510 is connected to the circulation line L3 through an outflow line L2. The circulation line L3 is coupled to a top of the tank housing 510. The circulation line L3 extends from a top toward a bottom within the storing space 512 to form a liquid inlet pipe 523, and an inlet 523a is provided at an end of the liquid inlet pipe 523. A third valve V3 is installed at the circulation line L3. The third valve V3 opens and closes a fluid channel of the circulation line L3.

The circulation line L3 is connected to the outflow line L2. The outflow line L2 is coupled to a bottom side of the tank housing 510. The outflow line L2 extends from a bottom side toward a top side in the storing space 512 to form a liquid outlet pipe 521, and an outlet 521a is provided at an end portion of the liquid outlet pipe 521.

A pump 600 is installed at the outflow line L2. The pump 600 provides a flow pressure so that a flow of the chemical is generated from the outlet 521a of the outflow line L2 to the inlet 523a through the circulation line L3 or to the nozzle 390 through the supply line L1. Meanwhile, although not shown, a heater for heating the treating liquid flowing through the circulation line L3 may be provided at the circulation line L3.

The tank housing 510 is connected to the charging line L4. The charging line L4 is coupled to a top side of the tank housing 510. A discharge port 525a of the charging line L4 is positioned at a top part the storing space 512. A chemical stored at the chemical supply source 700 is transferred to the storing space 512 through the charging line L4. The chemical discharged through the discharge port 525a falls and fills the storing space 512. A fourth valve V4 is installed on the charging line L4. The fourth valve V4 opens and closes a flow of the chemical toward the storing space 512.

The supply line L1 branches from the outflow line L2 downstream of the pump 600 of the outflow line L2. A first valve V1 is installed on the supply line L1. The first valve V1 opens and closes a flow of the chemical toward the nozzle 390.

Figure 4:
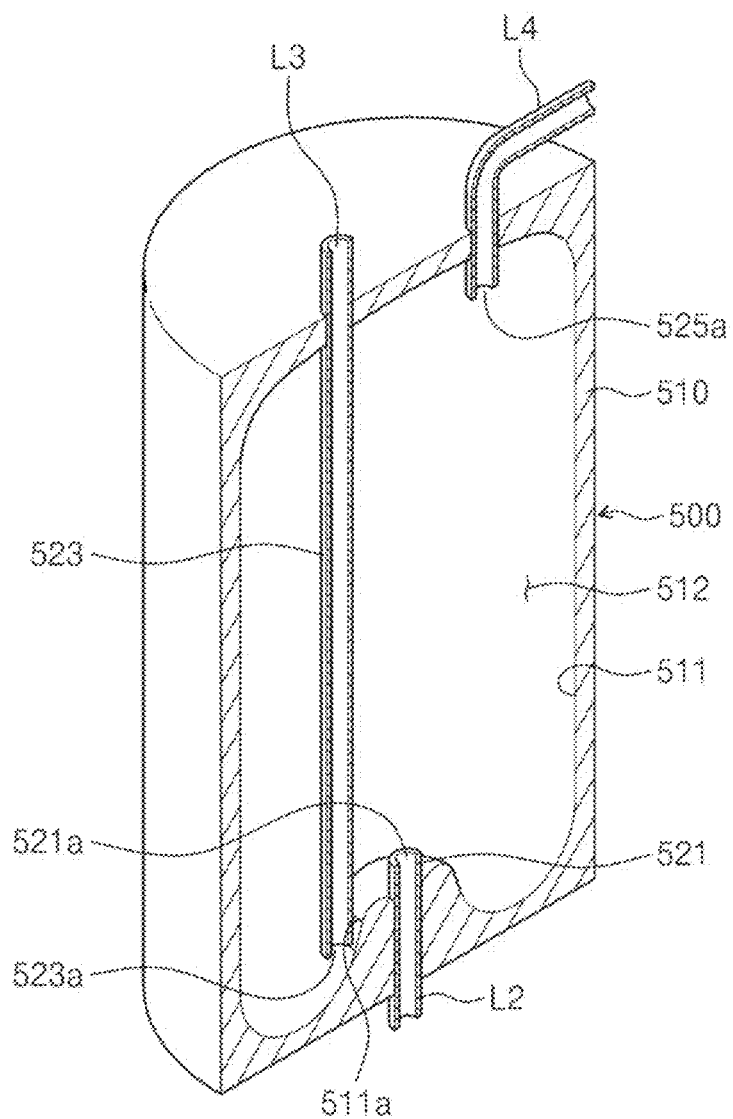
FIG. 4 is a cross-sectional perspective view of the liquid storage unit 500 according to an embodiment of the inventive concept.
Figure 5:
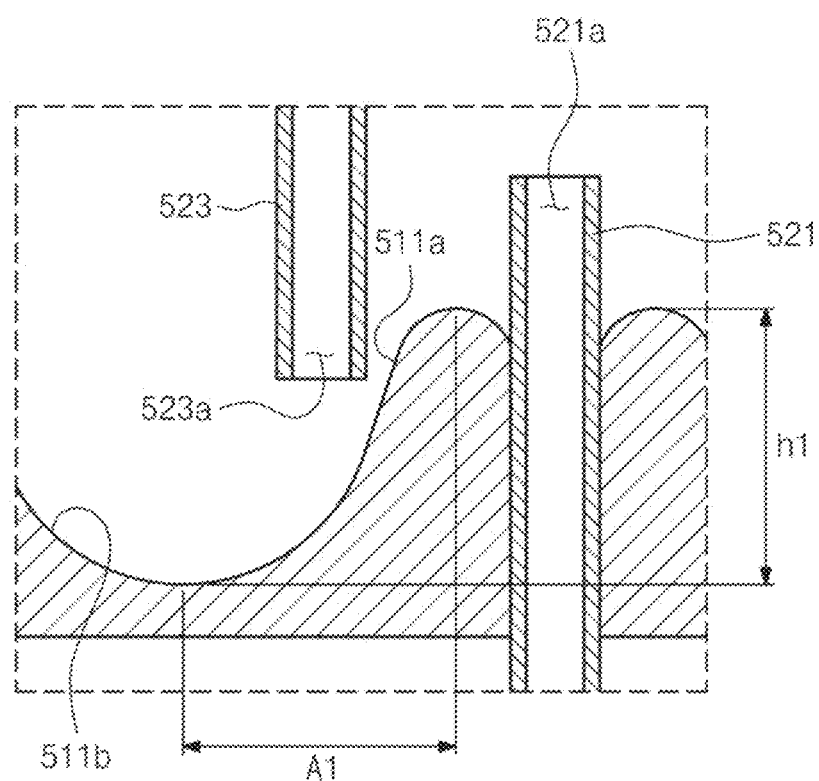
FIG. 5 is an enlarged cross-sectional view illustrating a correlation between a liquid outlet pipe and a liquid inlet pipe, and a first wall in an embodiment of FIG. 3.

FIG. 4 is a cross-sectional perspective view of a liquid storage unit 500 according to an embodiment of the inventive concept. FIG. 5 is an enlarged cross-sectional view illustrating a correlation between a liquid outlet pipe 521 and a liquid inlet pipe 523, and a first wall in an embodiment of FIG. 3. FIG. 3 will be referred to with reference to FIG. 4 and FIG. 5.

The liquid outlet pipe 521 penetrates into a tank housing. An end portion of the liquid outlet pipe 521 is provided as an outlet 521a. The liquid inlet pipe 523 penetrates into the tank housing. An end portion of the liquid inlet pipe 523 is provided as an inlet 523a. A liquid discharged through the liquid outlet pipe 521 may flow through an outflow line L2 and a circulation line L3 to the liquid inlet pipe 523.

A bottom surface of a wall 511 defining the storing space 512 has a protruding center, and is formed to be downwardly inclined toward a circumferential direction and then upwardly inclined again. In an embodiment, the bottom surface of the wall 511 defining the storing space 512 may be formed in a shape pressed into a doughnut.

The liquid outlet pipe 521 penetrates into a center region of a region protruding from the bottom surface. Among the wall 511 defining the storing space 512, a part of the wall of the region between the outlet 521a and the inlet 523a projected in the up/down direction is defined as a first wall 511a. The first wall 511a is formed to be downwardly inclined with respect to a direction toward the inlet 523a. The first wall 511a may be formed in a round shape in which an inclination angle decreases toward a downward direction. In addition, a second wall 511b formed to be upwardly inclined at an end of the first wall 511a is formed. The second wall 511b may be formed in a round shape in which an inclination angle increases as it rises. The first wall 511a functions as a guide surface for guiding a chemical introduced through the inlet 523a. By the first wall 511a, the chemical introduced through the inlet 523a does not directly flow to the outlet 521a and is guided along the first wall 511a to primarily prevent an invisible straight fluid channel from forming from the inlet 523a to the outlet 521a.

Some or all of the inlet 523a of the liquid inlet pipe 523 projected in the up/down direction is positioned within a region A1 at which the first wall 511a is projected in the up/down direction. The outlet 521a of the liquid outlet pipe 521 projected in the up/down direction is positioned outside the region A1 at which the first wall 511a is projected in the up/down direction.

The inlet 523a of the liquid inlet pipe 523 is positioned adjacent to a bottom surface of the storing space 512. In an embodiment, a position of the inlet 523a may be set to be lower than a height h1 of a topmost portion of the first wall 511a. In an embodiment, the position of the inlet 523a is set to be lower than a position of the outlet 521a. If the position of the inlet 523a is set to be lower than the position of the outlet 521a, an invisible fluid channel from the inlet 523a to the outlet 521a may be primarily prevented from being formed.

The liquid outlet pipe 521 may be inserted into the bottom surface of the storing space 512. The outlet 521a of the liquid outlet pipe 521 may be set to be higher than the height h1 of the topmost portion of the first wall 511a.

The liquid inlet pipe 523 is inserted as close as possible to the bottom surface defining the storing space 512 to prevent a generation of air bubbles due to a dropping. The liquid outlet pipe 521 is provided at the bottom surface defining the storing space 512 in order to smoothly take in the chemical. According to an embodiment of the inventive concept, the liquid inlet pipe 523 is provided close to the bottom surface to prevent air bubbles from being generated due to a dropping, and to smoothly take in the chemical into the liquid outlet pipe 521, and to prevent a linear fluid flow from the inlet 523a to the outlet 521a, thereby uniformly mixing the chemical in the storing space 512. In addition, a chemical discharged from the inlet 523a is guided to maintain the flow without colliding with the bottom surface, thereby reducing a pressure change caused by the chemical which is discharged colliding with the bottom surface.

Figure 6:
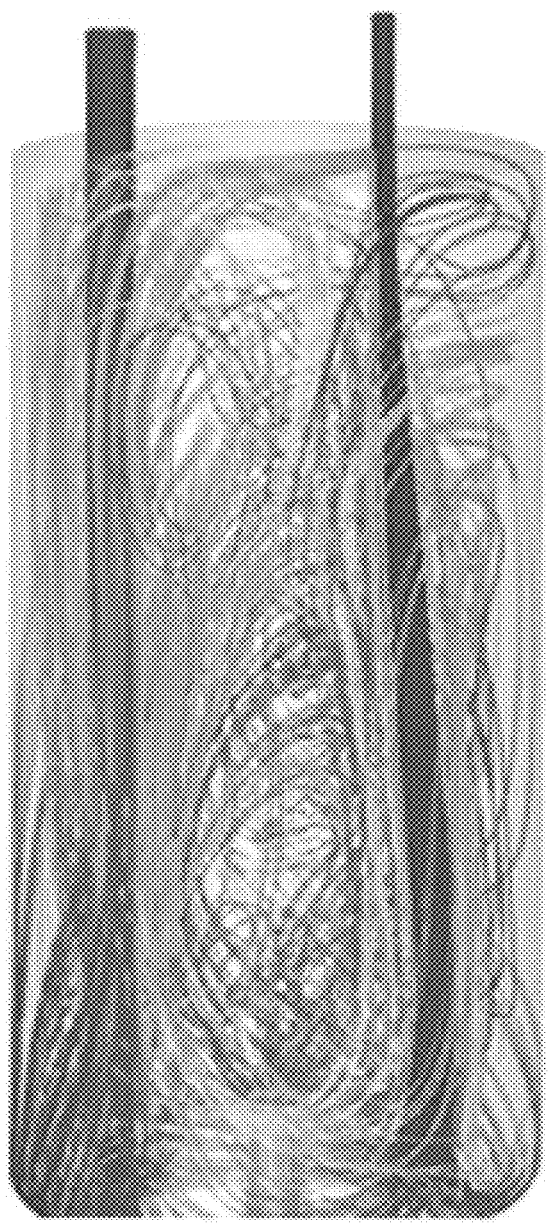
FIG. 6 is a fluid flow simulation at the liquid storage unit of the embodiment described in FIG. 3 to FIG. 5.

FIG. 6 is a fluid flow simulation at a liquid storage unit of the embodiment described in FIG. 3 to FIG. 5. When configured as in an embodiment of the inventive concept, a flow of a fluid is improved as shown, and a circulation flow within a storing space becomes active. When the circulation flow becomes active, a chemical may be evenly mixed and a temperature distribution may be stabilized.

Figure 7:
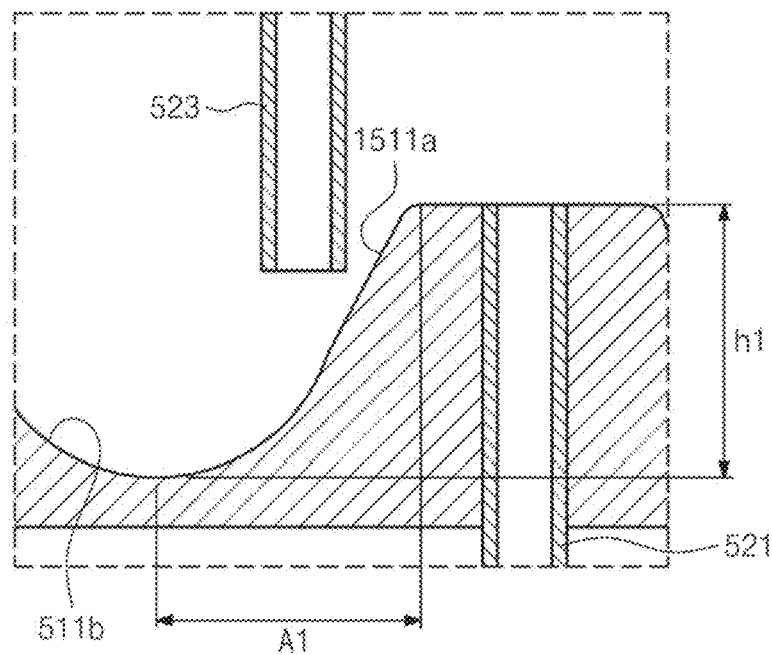
FIG. 7 is an enlarged cross-sectional view illustrating the correlation between the liquid inlet pipe and the liquid outlet pipe, and a first wall of the liquid storage unit according to another embodiment (second embodiment) of the inventive concept.

FIG. 7 is an enlarged cross-sectional view illustrating a correlation between a liquid inlet pipe and a liquid outlet pipe of a liquid storage unit according to another embodiment (second embodiment) of the inventive concept and a first wall. It will be described with reference to FIG. 4. In the description, the same configuration as the embodiment described in FIG. 3 to FIG. 5 will be replaced with the above description. A partial region forming the first wall 1511a may be formed to be maintained at a predetermined angle. And an outlet 521a may be set to be equal to a height h1 of a topmost portion of the first wall 1511a.

Figure 8:
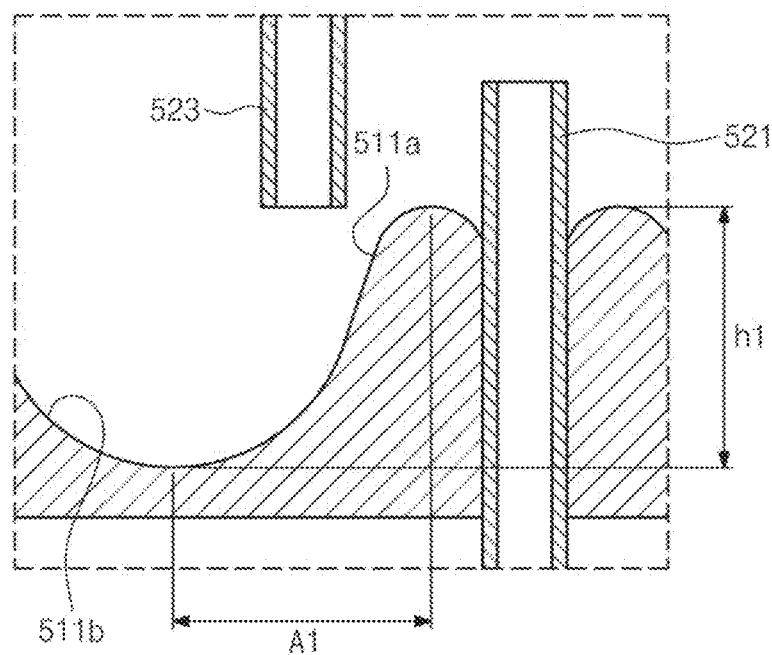
FIG. 8 is an enlarged cross-sectional view illustrating the correlation between the liquid inlet pipe and the liquid outlet pipe, and the first wall of the liquid storage unit according to another embodiment (third embodiment) of the inventive concept.

FIG. 8 is an enlarged cross-sectional view illustrating a correlation between a liquid inlet pipe and a liquid outlet pipe of a liquid storage unit according to another embodiment (third embodiment) of the inventive concept. It will be described with reference to FIG. 8. In the description, the same configuration as the embodiment described in FIG. 3 to FIG. 5 will be replaced with the above description. An inlet 523a of the liquid inlet pipe 523 may be set to be equal to a height h1 of a topmost portion of the first wall 511a.

Figure 9:
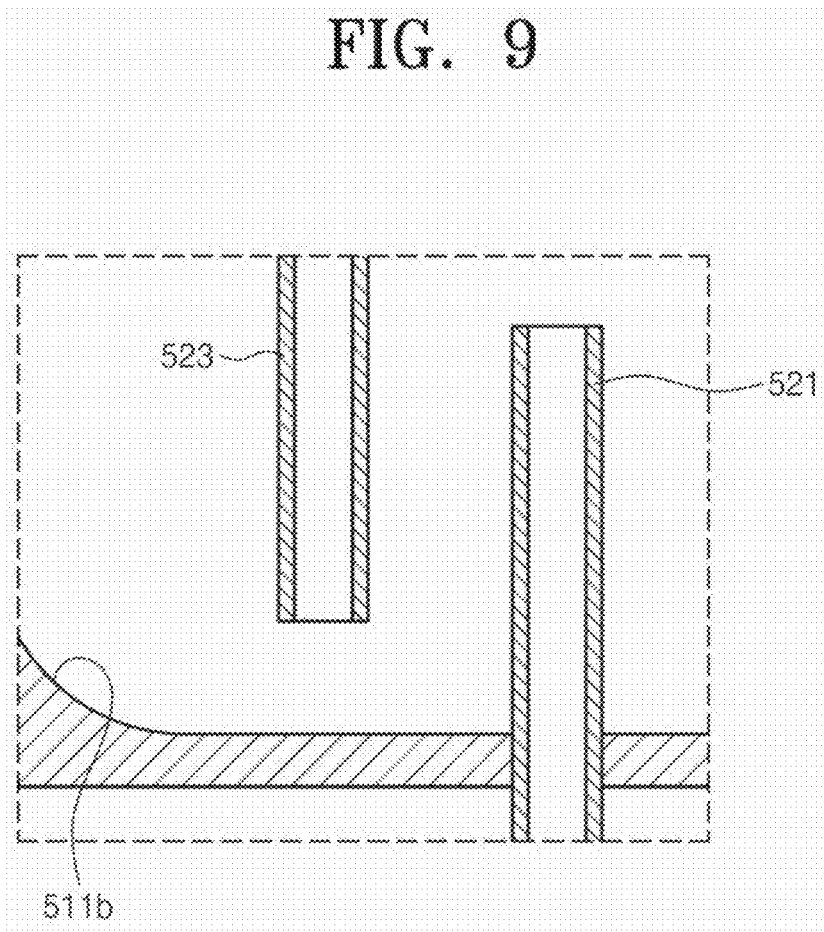
FIG. 9 is an enlarged cross-sectional view illustrating the correlation between the liquid inlet pipe and the liquid outlet pipe of the liquid storage unit according to another embodiment (fourth embodiment) of the inventive concept.

FIG. 9 is an enlarged cross-sectional view illustrating a correlation between a liquid inlet pipe and a liquid outlet pipe of a liquid storage unit according to another embodiment (fourth embodiment) of the inventive concept. In the description, the same configuration as the embodiment described in FIG. 3 to FIG. 5 will be replaced with the above description. Without relying on a height h1 of the first wall as described above, the inlet 523a can be positioned lower than the position of the outlet 521a.

Figure 10:
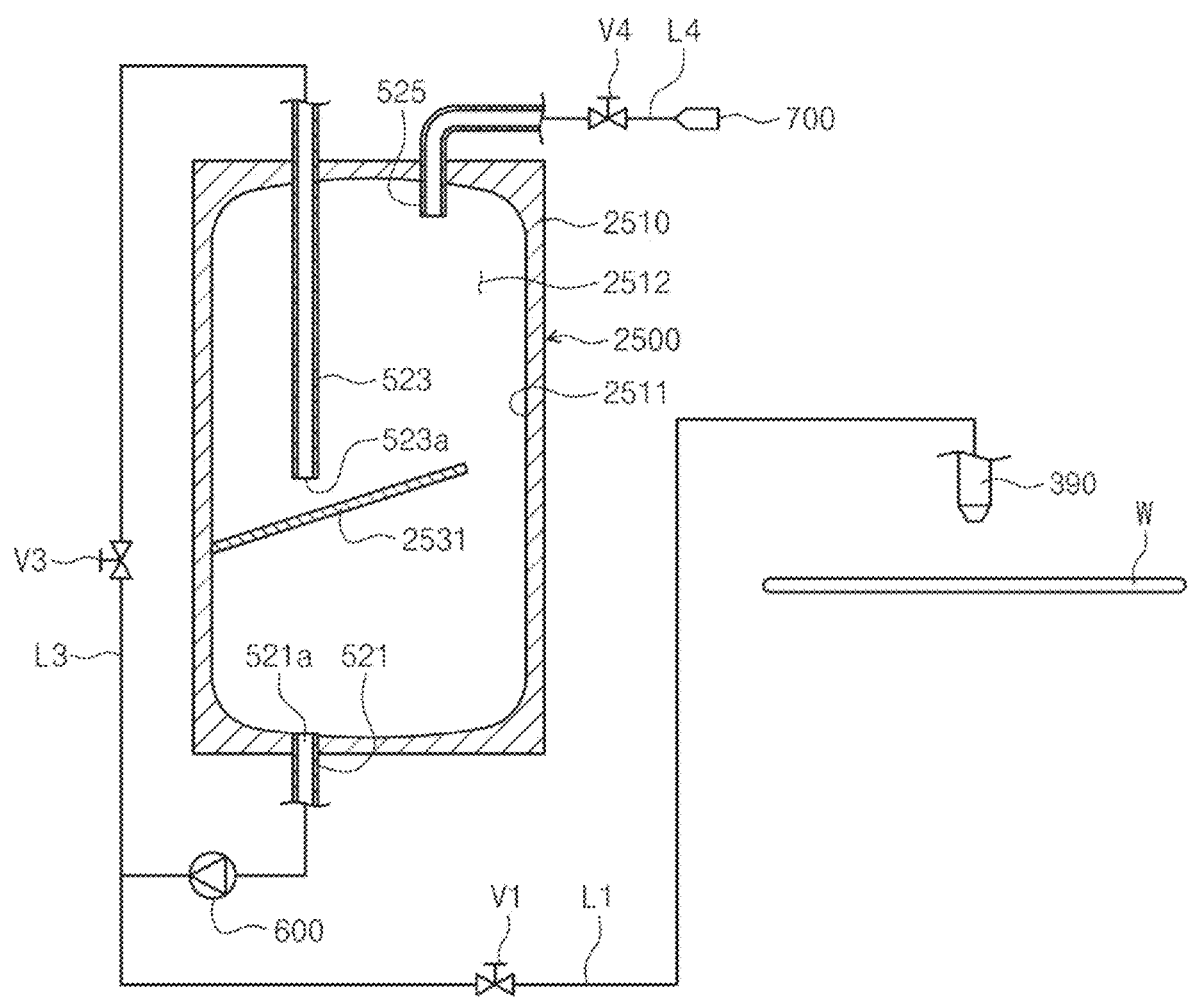
FIG. 10 is a cross-sectional view of the liquid storage unit according to another embodiment (fifth embodiment) of the inventive concept.

FIG. 10 is a cross-sectional view of a liquid storage unit according to another embodiment (a fifth embodiment) of the inventive concept. The liquid storage unit 2500 includes a tank housing 2510. The tank housing 2510 includes a storing space 2512. The storing space 2512 is defined by an inner wall of the tank housing 2510. The tank housing 2510 includes a partition wall 2531. The partition wall 2531 crosses between an inlet 523a of a liquid inlet pipe 523 and an outlet 521a of a liquid outlet pipe 521. The partition wall 2531 is provided between the inlet 523a and the outlet 521a, and functions as a guide surface for guiding a liquid introduced from the inlet 523a to not directly flow to the outlet 521a. The chemical flows through the storing space 2512 by the partition wall 2531. The partition wall 2531 may be formed to be upwardly inclined to a side. In an embodiment, the partition wall 2531 is provided to be inclined such that an opened side faces upward so that an introduced liquid flows upward.

Figure 11:
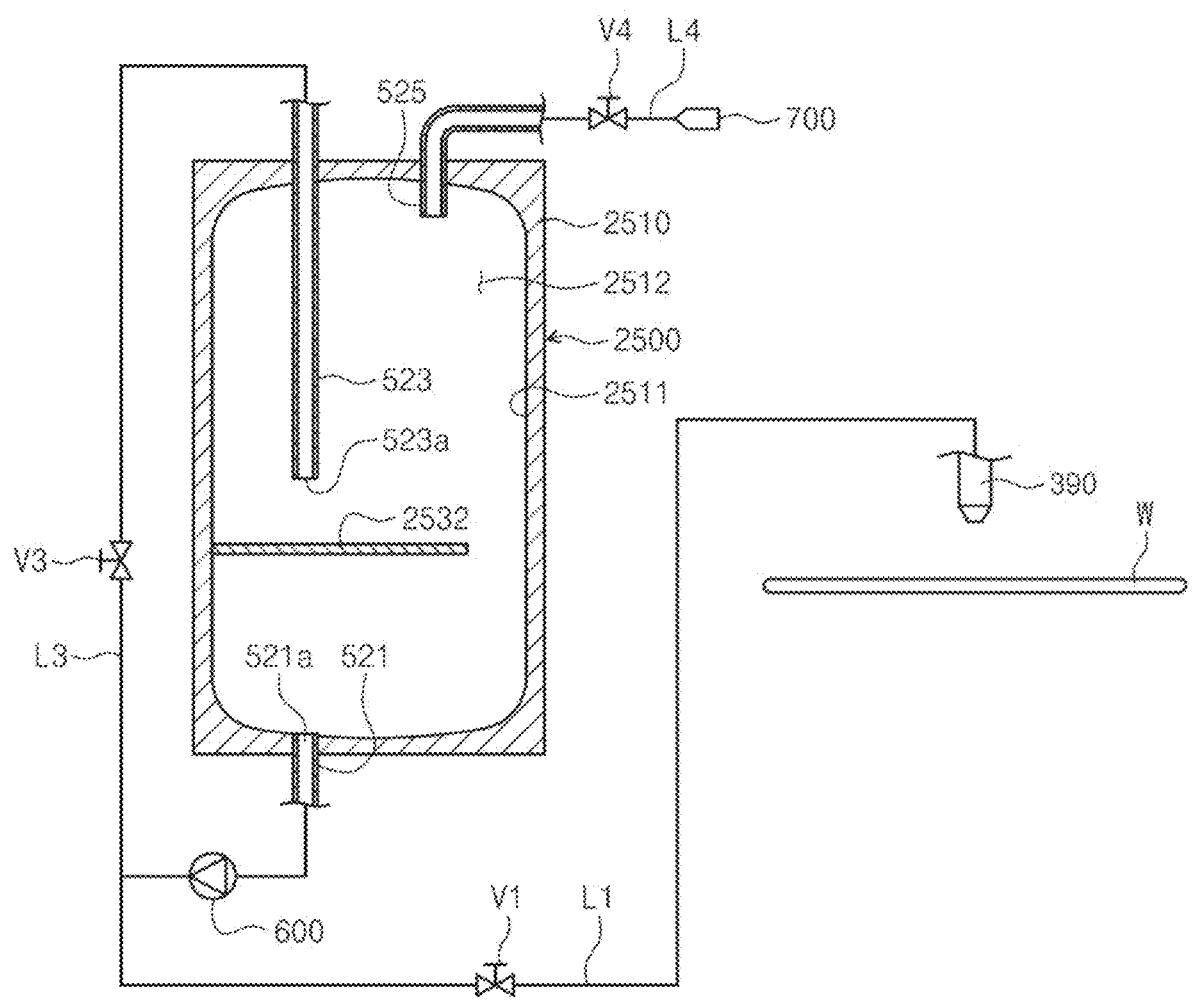
FIG. 11 is a cross-sectional view of the liquid storage unit according to another embodiment (sixth embodiment) of the inventive concept.

FIG. 11 is a cross-sectional view of a liquid storage unit according to another embodiment (a sixth embodiment) of the inventive concept. It will be described with reference to FIG. 11. In the description, the same configuration as the embodiment described in FIG. 10 will be replaced with the above description. A partition wall 2532 may be formed horizontally. A fluidity through which a chemical flow may be reduced compared to the embodiment described in FIG. 10, but a difference generated by the partition wall 2532 is reduced.

Figure 12:
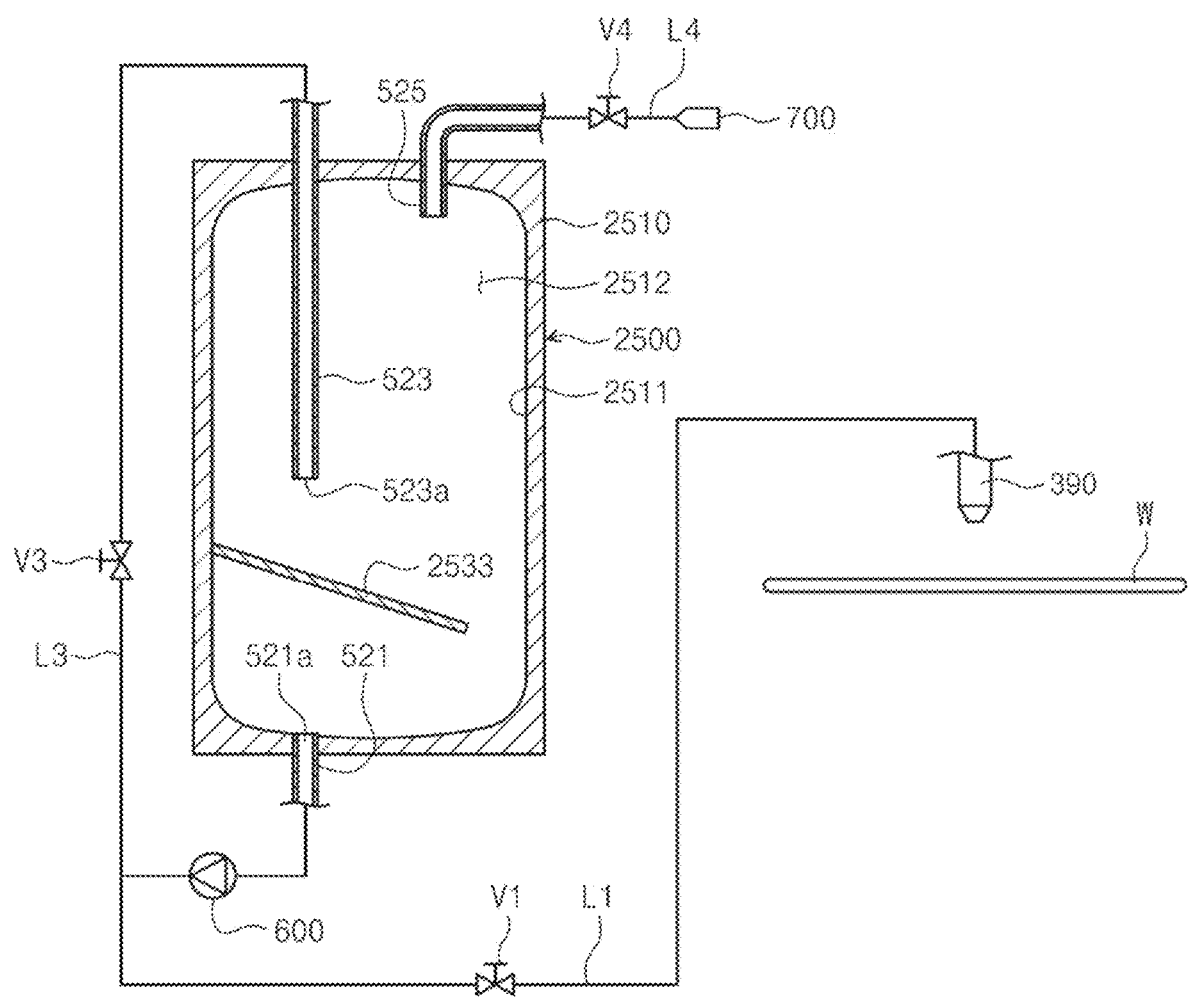
FIG. 12 is a cross-sectional view of the liquid storage unit according to another embodiment (a seventh embodiment) of the inventive concept.

FIG. 12 is a cross-sectional view of a liquid storage unit according to another embodiment (a seventh embodiment) of the inventive concept. It will be described with reference to FIG. 12. In the description, the same configuration as the embodiment described in FIG. 10 will be replaced with the above description. A partition wall 2533 may be formed to be downwardly inclined to a side. In an embodiment, the partition wall 2533 is provided to be inclined such that an open side faces downward. A fluidity through which a chemical flow may be reduced compared to the embodiment described in FIG. 10, but a difference generated by the partition wall 2533 is reduced.

Figure 13:
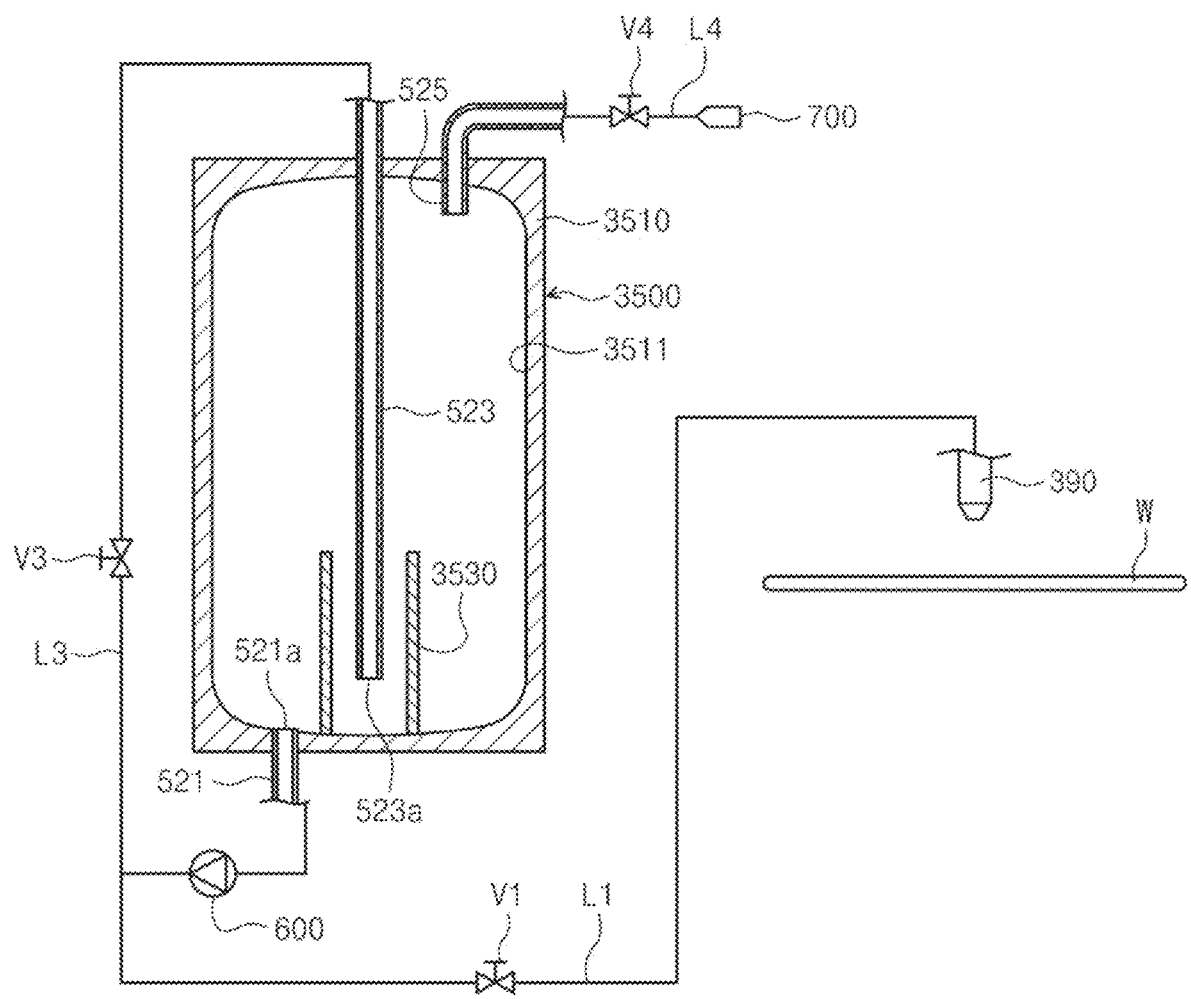
FIG. 13 is a cross-sectional view of the liquid storage unit according to another embodiment (eighth embodiment) of the inventive concept.

FIG. 13 is a cross-sectional view of a liquid storage unit according to another embodiment (eighth embodiment) of the inventive concept. The liquid storage unit 3500 includes a tank housing 3510. The tank housing 3510 includes a storing space 3512. The storing space 3512 is defined by an inner wall of the tank housing 3510. The tank housing 3510 includes a partition wall 3530. The partition wall 3530 is formed in a cylindrical shape. The partition wall 3530 surrounds an inlet 523a. The partition wall 2531 surrounds the inlet 523a and functions as a guide surface for guiding a liquid introduced from the inlet 523a to not flow directly to the outlet 521a. A chemical introduced flows upward due to the partition 2531 and flows through the storing space 2512.

Figure 14:
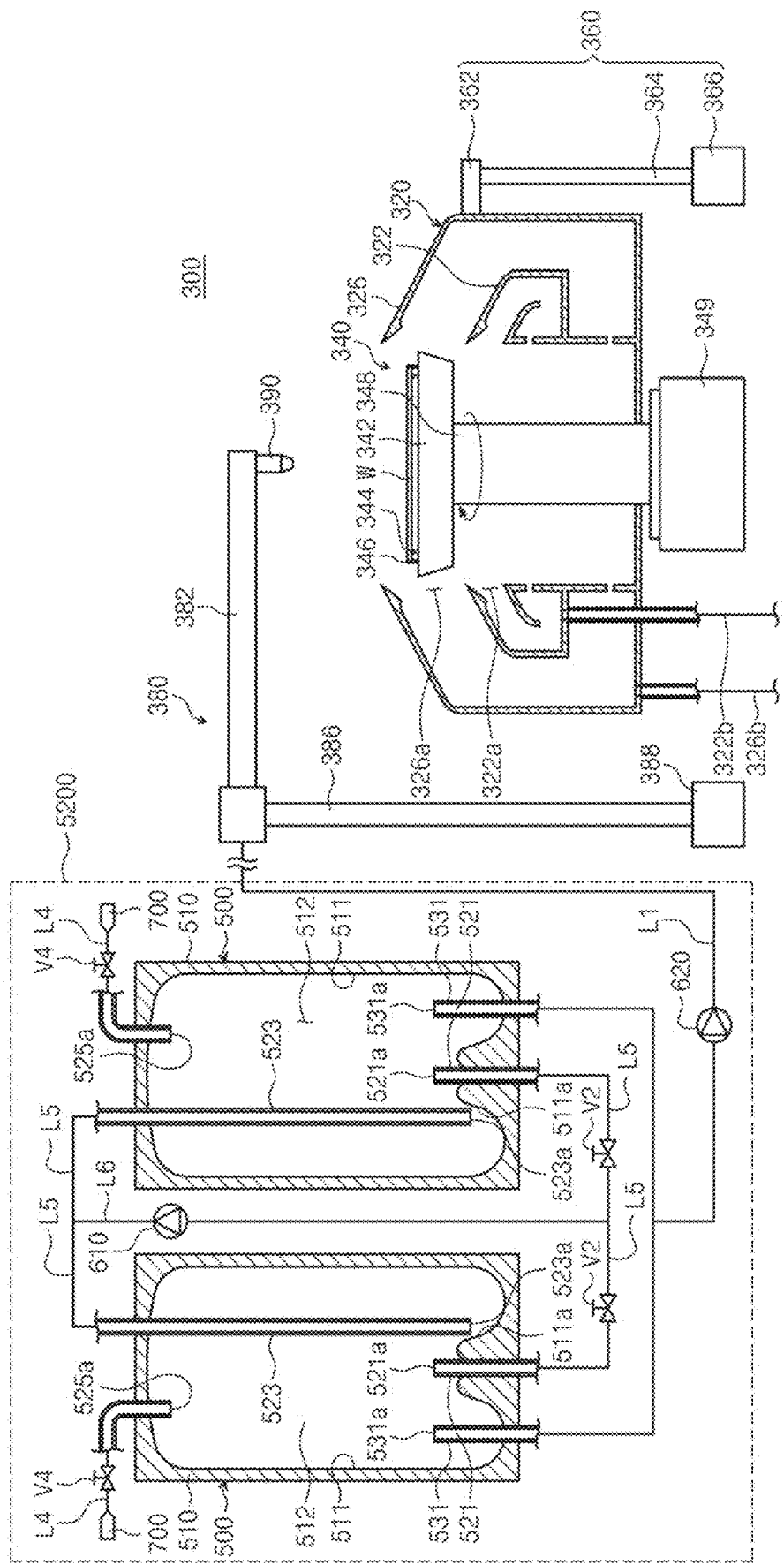
FIG. 14 is a cross-sectional view illustrating the substrate treating apparatus 300 including the liquid supply system 5200 according to a second embodiment.

FIG. 14 is a cross-sectional view illustrating a substrate treating apparatus 300 including a liquid supply system 5200 according to a second embodiment. The substrate treating apparatus 300 is the same as that described in FIG. 2, and will be replaced with the description of FIG. 2. The liquid supply system 5200 of the second embodiment includes two tank housings 510. The two tank housings 510 have the same structure.

Each tank housing 510 defines a storing space 512. In an embodiment, the tank housing 510 forms a storing space 512. The treating liquid is stored in the storing space 512.

Each of the tank housings 510 is connected to the circulation line L5. The circulation line L5 includes an integrated circulation line L6. A first pump 610 is installed at the integrated circulation line L6. The first pump 610 provides a flow pressure for circulating the treating liquid. A heater (not shown) for heating the treating liquid flowing through the integrated circulation line L6 may be provided at the integrated circulation line L6.

An end of the circulation line L5 is coupled to a top side of the tank housing 510. The circulation line L5 extends from a top side toward a bottom side in the storing space 512 to form a liquid inlet pipe 523, and an inlet 523a is provided at an end portion of the liquid inlet pipe 523. In addition, the other end of the circulation line L5 is coupled to a bottom side of the tank housing 510. The circulation line L5 extends from the bottom side toward the top side in the storing space 512 to form a first liquid outlet pipe 521, and a first outlet 521a is provided at an end portion of the first liquid outlet pipe 521. The first pump 610 provides a pressure so that a treating liquid flows from the first outlet 521a toward the inlet 523a.

A second valve V2 is installed on the circulation line L5. The second valve V2 opens and closes a fluid channel of the circulation line L5. The treating liquid stored in the storing space 512 circulates through the circulation line L5 and the integrated circulation line L6 according to the opening of the second valve V2 and an operation of the first pump 610.

A second liquid outlet pipe 531 is provided to extend from the bottom side toward the top side in the storing space 512. The second liquid outlet pipe 531 may be provided around the first liquid outlet pipe 521. In an embodiment, if the first liquid outlet pipe 521 is provided at a center of a bottom surface of the storing space 512, the second liquid outlet pipe 531 may be provided at a position offset from the center. If the second liquid outlet pipe 531 is provided to protrude and extend at a predetermined height from the bottom surface, it is possible to prevent suspended solids which have sunk to the bottom surface of the storing space 512 from being supplied to the substrate treating apparatus 300. The second liquid outlet pipes 531 are connected to the supply line L1, respectively. A second pump 620 is installed on the supply line L1. The second pump 620 provides a pressure so that the treating liquid is supplied to the nozzle 390.

The tank housing 510 is connected to a charging line L4. The charging line L4 is coupled to the top side of the tank housing 510. A discharge port 525a of the charging line L4 is positioned above the storing space 512. A chemical stored in the chemical supply source 700 is transferred to the storing space 512 through the charging line L4. A chemical discharged through the discharge port 525a falls and fills the storing space 512. A fourth valve V4 is installed on the charging line L4. The fourth valve V4 opens and closes the flow of the chemical toward the storing space 512.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A liquid storage unit comprising:
   a tank housing defining a storing space therein;
   a liquid outlet pipe penetrating into the tank housing and having an outlet formed thereon; and
   a liquid inlet pipe penetrating into the tank housing and having an inlet formed thereon, and
   wherein a first guide surface is provided between the outlet and the inlet,
   wherein a part or all of the inlet at least partially overlaps the first guide surface when seen from above.

2. The liquid storage unit of claim 1, wherein the first guide surface is configured to be formed so a flow of a liquid introduced from the inlet is guided further away from the outlet.

3. The liquid storage unit of claim 1, wherein the first guide surface is provided to have a height which decreases in a direction toward a part at which the inlet is provided from a part at which the outlet is provided.

4. The liquid storage unit of claim 1, wherein the outlet is positioned outside of a region at which the first guide surface is projected in an up/down direction.

5. The liquid storage unit of claim 1, wherein the first guide surface is a portion among a bottom surface defining the storing space, and the bottom surface has a center which upwardly protrudes and a height which decreases from the center toward an edge direction, and wherein the first guide surface is defined as a surface having the height which decreases, and the liquid outlet pipe is provided penetrating through the center which upwardly protrudes.

6. The liquid storage unit of claim 1, wherein the first guide surface is a rounded shape.

7. The liquid storage unit of claim 2, wherein a bottom surface includes a second guide surface having a height which increases from an end portion of the first guide surface toward an edge direction.

8. The liquid storage unit of claim 7, wherein the second guide surface is a rounded shape.

9. The liquid storage unit of claim 1, wherein the inlet of the liquid inlet pipe is positioned adjacent to a bottom surface of the storing space.

10. The liquid storage unit of claim 9, wherein the inlet is positioned at a position lower than a top end of the first guide surface or at a same level.

11. The liquid storage unit of claim 1, wherein the outlet is positioned at a position higher than a top portion of the first guide surface or at a same level.

12. The liquid storage unit of claim 1, wherein the inlet is positioned at a position lower than a top end of the first guide surface or at a same level, and wherein the outlet is positioned at a position higher than a top portion of the first guide surface or at a same level.

13. The liquid storage unit of claim 1, wherein a level of the outlet is higher than a level at which the inlet is positioned.

14. A liquid storage unit comprising:

a tank housing defining a storing space therein; and a liquid outlet pipe penetrating into the tank housing and having an outlet formed thereon;

a liquid inlet pipe penetrating into the tank housing and having an inlet formed thereon; and a first line connecting the liquid outlet pipe and the liquid inlet pipe, and wherein the outlet is positioned at a position higher than a position of the inlet.

15. The liquid storage unit of claim 14 further comprising a pump provided at the first line and configured to generate a flow of a liquid from the liquid outlet pipe to the liquid inlet pipe.

16. The liquid storage unit of claim 14 further comprising a liquid charging line connected through a liquid supply source and a second line, and penetrating into the tank housing.

17. A liquid storage unit comprising:

a tank housing defining a storing space therein;

a liquid outlet pipe penetrating into the tank housing and having an outlet formed thereon; and a liquid inlet pipe penetrating into the tank housing and having an inlet formed thereon, and wherein a first guide surface is provided between the outlet and the inlet, and the first guide surface is defined as a bottom surface defining the storing space.

18. The liquid storage unit of claim 17, wherein the first guide surface is a rounded shape.

19. The liquid storage unit of claim 18, wherein the bottom surface includes a second guide surface having a height which increases from an end portion of the first guide surface toward an edge direction.

20. The liquid storage unit of claim 17, wherein the outlet is positioned outside of a region at which the first guide surface is projected in an up/down direction.

* * * * *